United States Patent [19]

Meaney et al.

[11] Patent Number: 5,075,677
[45] Date of Patent: Dec. 24, 1991

[54] VOLTAGE-SWITCHING D/A CONVERTER USING P- AND N-CHANNEL MOSFETS

[75] Inventors: Richard A. Meaney, Andover, Mass.; Raymond J. Speer, Donegal, Ireland

[73] Assignee: Analog Devices, Inc., Norwood, Mass.

[21] Appl. No.: 386,298

[22] Filed: Jul. 27, 1989

[51] Int. Cl.$^5$ .............................................. H03M 1/66
[52] U.S. Cl. .................................... 341/136; 341/154; 307/577
[58] Field of Search ............... 341/136, 118, 119, 144, 341/154, 135; 307/576, 577, 579, 296.6, 296.8, 491

[56] References Cited

U.S. PATENT DOCUMENTS 4,558,242 12/1985 Tuthill et al. ...................... 341/136
4,800,365 1/1989 White et al. ...................... 341/136

Primary Examiner—A. D. Pellinen
Assistant Examiner—Brian Young
Attorney, Agent, or Firm—Wolf, Greenfield & Sacks

[57] ABSTRACT

In a voltage-switching digital-to-analog converter, each bit is switched by a switching circuit which uses a p-channel MOSFET as a $V_{REF}$ switch and an n-channel MOSFET as an Agnd switch, with a control circuit for controlling the signal applied to the gate of one of the devices (e.g., the n-channel device) to cause its "ON" resistance to match the "ON" resistance of the other device (e.g., the p-channel device). The control circuit includes reference n-channel and p-channel devices. A control signal is developed to drive the reference n-channel device to a condition wherein its drain current and drain-source voltage match those of the reference p-channel device, thereby causing their $R_{ON}$s to match. The drive signal is taken as the output of the control means and is used to power the driver for the n-channel Agnd switches.

4 Claims, 6 Drawing Sheets

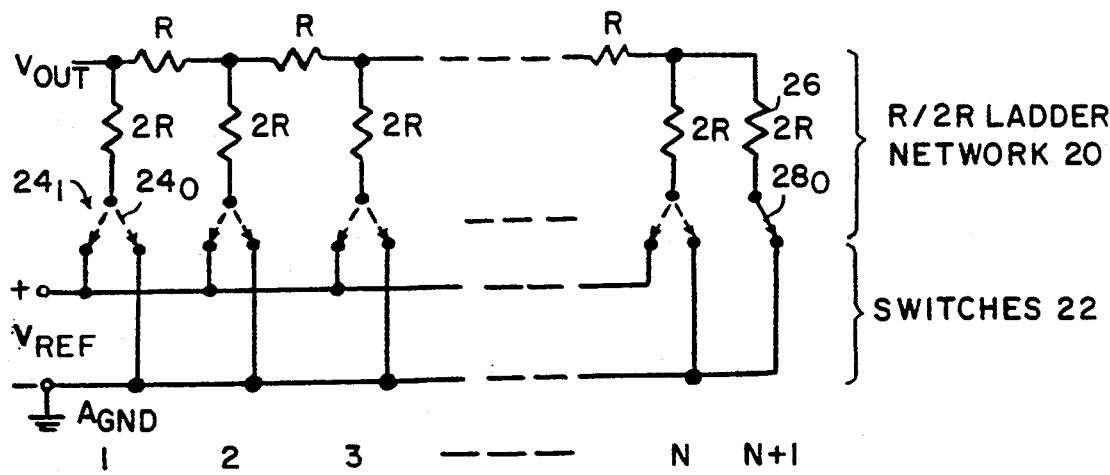
FIG. 1 PRIOR ART
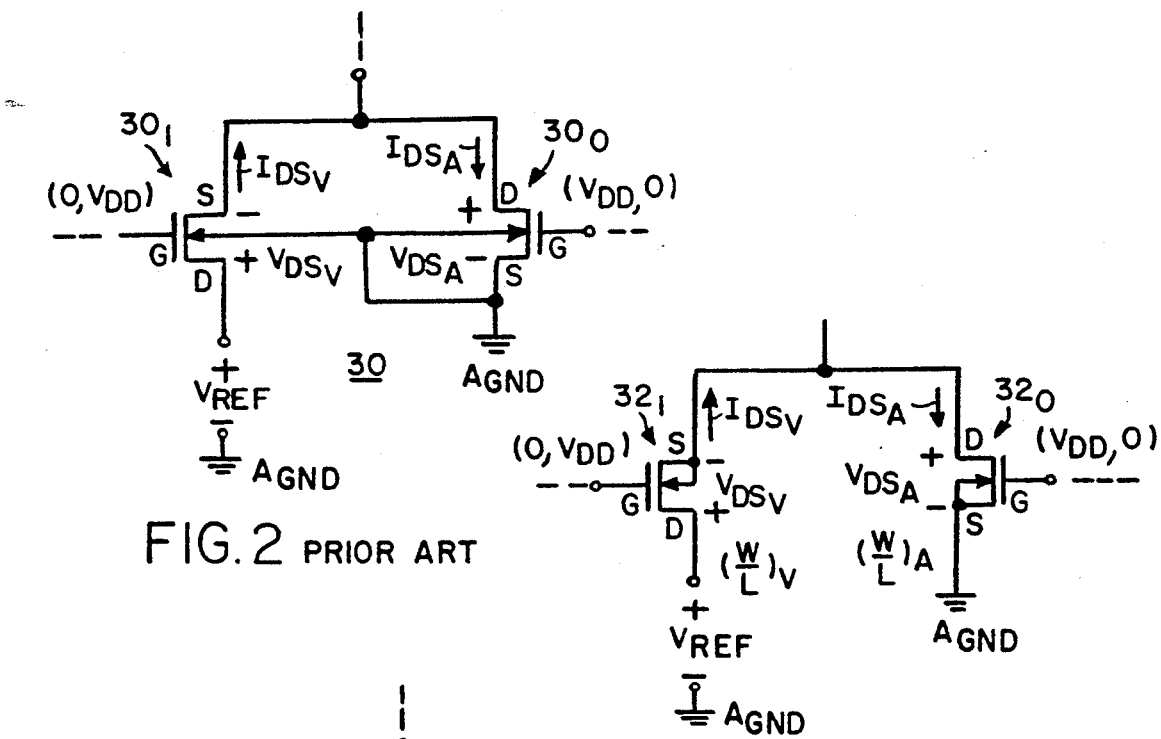
FIG. 2 PRIOR ART
FIG. 3 PRIOR ART
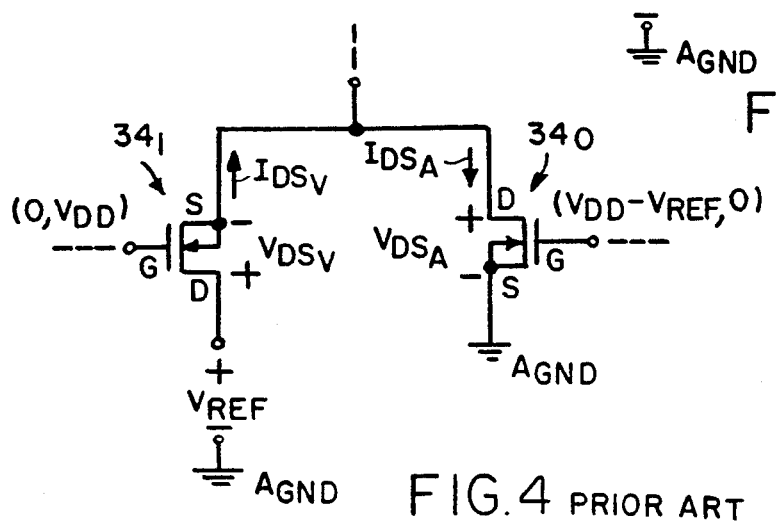
FIG. 4 PRIOR ART

VOLTAGE-SWITCHING D/A CONVERTER USING P- AND N-CHANNEL MOSFETS

FIELD OF THE INVENTION

This invention relates to the field of digital-to-analog converters (DACs) and, more particularly, to a switching scheme for CMOS DACs operated in voltage-switching mode. The switching scheme includes both p-channel and n-channel devices with matched $R_{ON}$ values.

BACKGROUND OF THE INVENTION

Referring to FIG. 1, the basic voltage-switching (or voltage-mode) CMOS DAC of the prior art includes a thin-film R-2R ladder network 20 and for each leg of the ladder network, a single-pole, double-throw switch. The pole of the switch is connected to the ladder leg; one throw is connected to a reference voltage $V_{ref}$ and the other throw is connected to analog ground. In practice, the single-pole, double-throw switch is implemented as a pair of MOS switches, generally as indicated at 22. The switches in each pair are complementarily-driven; such as switch pair 24 and 24, they consist of a $V_{ref}$ (reference voltage) switch (e.g., $24_1$) and an Agnd (analog ground) switch (e.g., $24_0$) Only one of the switches in each pair is on at any moment, due to complementary operation. The state of each switch pair is determined by a corresponding one of the digital code bits supplied to the converter's digital input. The ladder network termination resistor 26 is connected to Agnd via a permanently "ON" Agnd switch $28_0$.

In practice, ideal switches cannot be fabricated; each MOS switch has a finite "ON" resistance, rather than a zero resistance. While this finite resistance is small, it is not inconsequential and it can affect DAC accuracy. To minimize error and make high accuracy DACs using these non-ideal switches, the following rules generally are employed:

First, the switch "ON" resistance, $R_{ON}$, is binarily scaled from bit to bit.

Second, the $R_{ON}$s of the $V_{ref}$ switch and Agnd switch in each pair are matched.

A number of circuit techniques have been developed to produce matched switches. Referring to FIG. 2, a first type of prior art switch pair 30 is formed of a $V_{ref}$ switch transistor $30_1$ and an Agnd switch transistor $30_0$, both of which are n-channel devices. This is the simplest switching scheme and is primarily employed when a conventional, current switching (or current mode) DAC is used in voltage-switching mode. Such a circuit presents an inherent mismatch of $R_{ON}$ values, caused primarily by a mismatch in gate-source voltages (i.e $V_{gs}$). Moreover, the $R_{ON}$ mismatch worsens as $V_{ref}$ increases.

In another prior art embodiment shown in FIG. 3, a first order cancellation of this mismatch is achieved by appropriate device geometry scaling.

This design has a higher upper limit for the reference voltage, but also suffers some disadvantages. For example, increased die area is required, as each $V_{ref}$ switch requires its own p-well. Further, the reference voltage is restricted to values close to the particular value for which the ratios of width to length achieve first order compensation of $V_{gs}$ mismatch.

In yet another case, showed in FIG. 4, the "ON" gate voltage of the Agnd switch $34_0$ is adjusted in accordance with the value of $V_{ref}$, thus eliminating the $V_{gs}$ mismatch and achieving good "ON" resistance matching that of the $V_{ref}$ switch. The FIG. 4 approach is more fully explained in Tuthill et al., U.S. Pat. No. 4,558,242 issued Dec. 10, 1985, to as the present invention. The Tuthill, et al. patent contains a more detailed discussion of the other prior art switches of FIGS. 2 and 3 also, as well as their characteristics and compensation, and is hereby incorporated by reference for those discussions.

The embodiment of FIG. 4 adjusts the "ON" gate voltage of the Agnd switch according to the value of $V_{ref}$, to provide $V_{gs}$ equality (and thus, $R_{ON}$ matching) over a wider reference range. From U.S. Pat. No. 4,558,442, the following salient observations may be made of the switch pair of FIG. 4. First, the $V_{ref}$ and the Agnd switches are of the same size. Second, the switch devices occupy separate p-wells. Third, the "ON" gate voltage of the Agnd switch is $V_{dd}$-$V_{ref}$, whereas that of the $V_{ref}$ switch is $V_{dd}$. Good $R_{ON}$ matching is achieved by having $V_{dd}$-$V_{ref}$ much larger than $V_{TV}+V_{DSV}$ or $V_{TA}$-$V_{DSA}$, where $V_{TV}$=threshold voltage of the $V_{ref}$ switch
$V_{DSV}$=drain-source voltage of the $V_{ref}$ switch
$V_{TA}$=threshold voltage of the Agnd switch
$V_{DSA}$=drain source voltage of the Agnd switch A practical implementation of the scheme of FIG. 4 involves the design of an Agnd switch "ON" gate voltage generator circuit 40 as illustrated in FIG. 5. This "$V_{dd}$-$V_{ref}$" generator circuit drives the positive power rail for all the Agnd switch drivers. In general, an op-0amp circuit 42, shown in FIG. 6, can be used to implement this function, but FIG. 7 shows a more specific integrated circuit implementation 44. FIG. 8 shows how the Agnd switch drivers 46 are driven from generator circuit 44 (or 42).

All of the prior art schemes illustrated in FIGS. 2-4, it should be noted, use n-channel MOSFETs. However, the use of n-channel MOSFET's requires that the gate of the $V_{ref}$ switch be driven by a voltage sufficiently greater than $V_{ref}$ as to achieve the desire $R_{ON}$. This means that $V_{ref}$ has to be several volts lower than the most positive supply voltage, which, in turn, restricts the potential range of the output signal swing for such a converter.

Accordingly, it is an object of the invention to provide an improved switching circuit for CMOS voltage-switching DACs.

A further object of the invention is to provide in a CMOS voltage-switching DAC, a switching circuit which can maintain a substantial signal swing even under low supply voltage conditions.

Yet another object of the invention is to provide a switching circuit which requires only small die area.

Still another object of the invention is to provide a switching circuit which provides dynamic matching of $R_{ON}$ values.

A still further object of the invention is to provide a switching circuit which does not require the generation of complementary switching signals and thereby provides an opportunity to better match the timing of device switching.

SUMMARY OF THE INVENTION

The foregoing, and other objects and advantages which will hereinafter become more apparent, are achieved in a switching circuit which uses a p-channel device as a $V_{ref}$ switch and an n-channel device as an Agnd switch, with means for controlling the signal applied to the gate of one of the devices, such as the n-channel device, as a function of the operating conditions on the other device, to match the $R_{ON}$ values of the two devices. The control means includes a reference n-channel device and a reference p-channel device. A control signal is developed to drive the reference n-channel device (for example) to a condition wherein its drain current and drain-source voltage match those of the reference p-channel device, thereby causing their $R_{ON}$s to match. The control signal is taken as the output of the control means and is used to power the driver for the n-channel Agnd switches, and to thereby set the voltage applied to the gates of the Agnd switches. Of course, another embodiment is possible, wherein the drain current and drain-source voltage of the p-channel device are matched to those of the n-channel device by a control signal which would then be used to drive the gates of the $V_{ref}$ switches.

The invention will be more fully understood from the following detailed description, which should be read in conjunction with the accompanied drawings.

BRIEF DESCRIPTION OF THE DRAWING

In the drawings,

FIG. 1 shows, in schememtic form, the basic elements of a conventional, prior art CMOS voltage-switching DAC of the type wherein the present invention is used;

FIG. 2 is a schematic diagram for a first prior art arrangement for the switch pairs of FIG. 1:

FIG. 3 is a schematic circuit diagram for a second prior art arrangement for the switch pairs of FIG. 1;

FIG. 4 is a schematic circuit diagram for a third prior art arrangement for the switch pairs of FIG. 1;

FIG. 7 is connected to drive the gate of the Agnd switch of FIG. 4;

DETAILED DESCRIPTION

Figure 5:
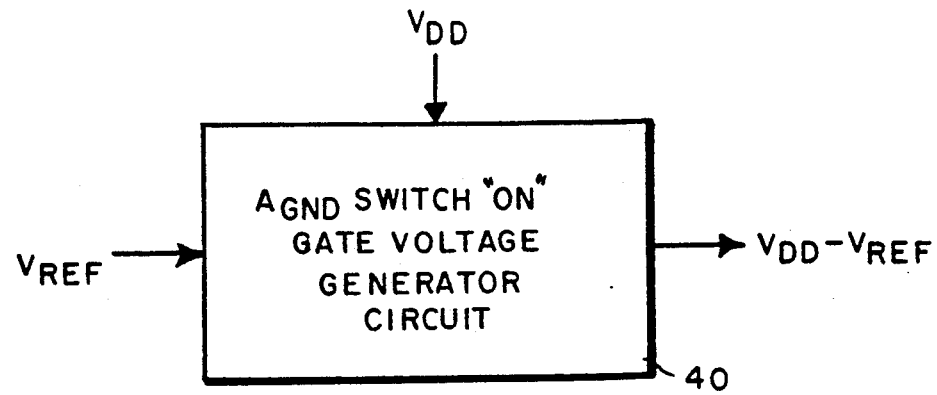
FIG. 5 is a block diagram of a gate voltage generator for uses with the circuit of FIG. 4.
Figure 6:
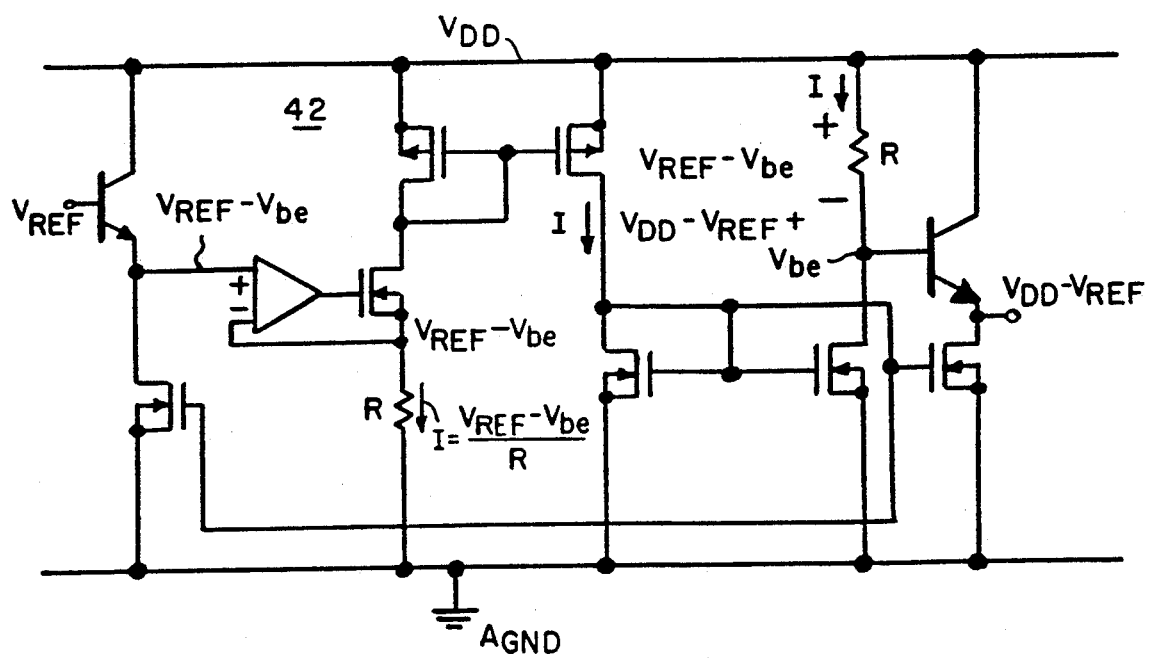
FIG. 6 is a first schematic circuit diagram for the gate voltage generator of FIG. 5.
Figure 7:
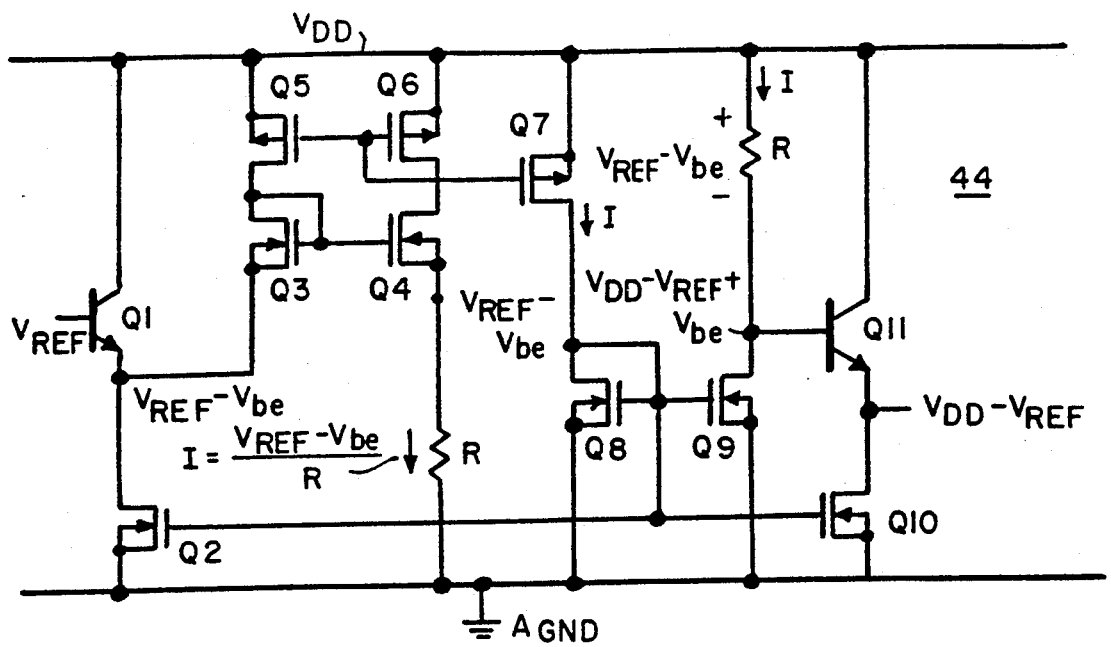
FIG. 7 is a schematic circuit diagram of a second integrated circuit implementation for the gate voltage generator of FIG. 5.
Figure 8:
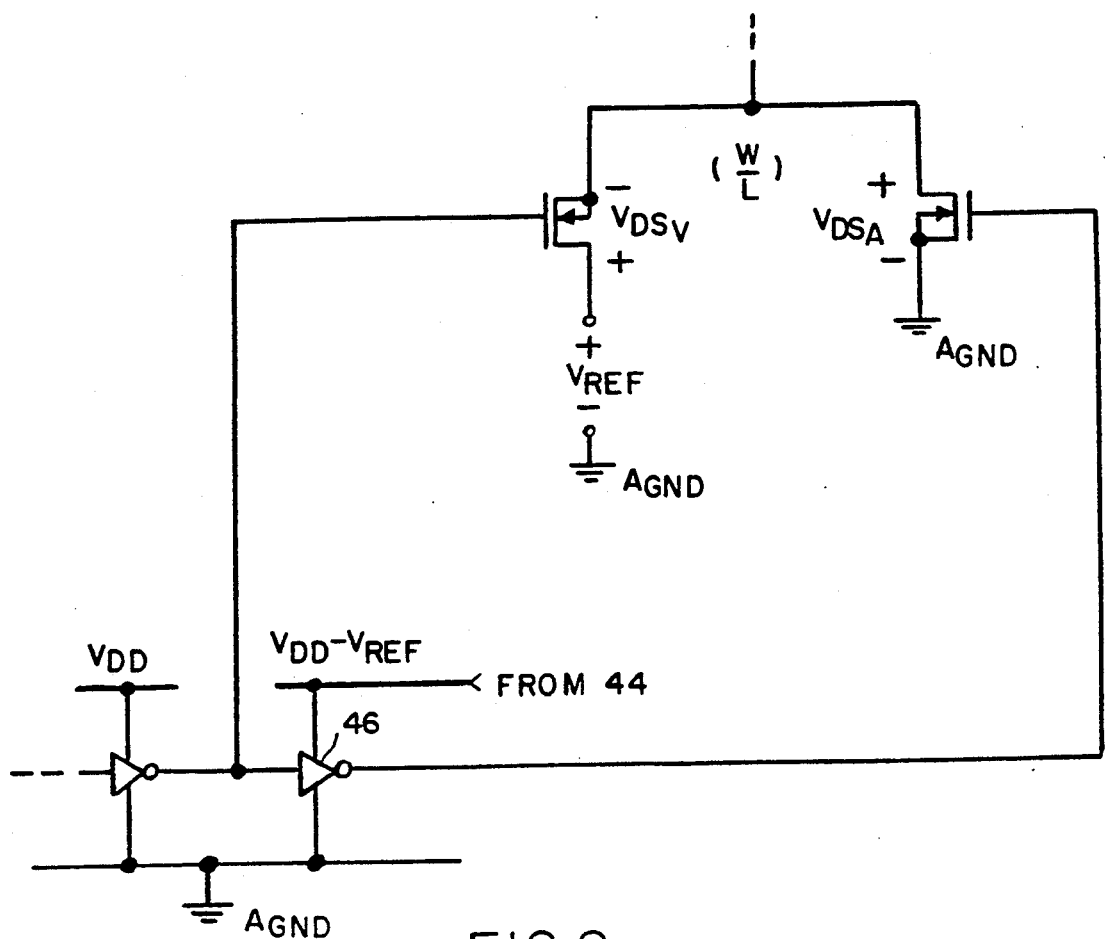
FIG. 8 is a simplified schematic circuit diagram showing how the generator of FIG. 6
Figure 9:
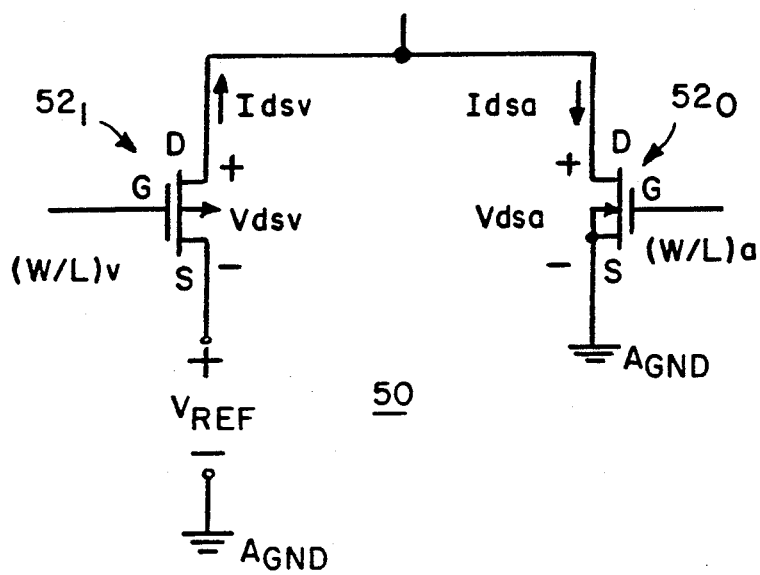
FIG. 9 is a schematic circuit diagram for a $V_{ref}$-Agnd switch pair according to the present invention.
Figure 10:
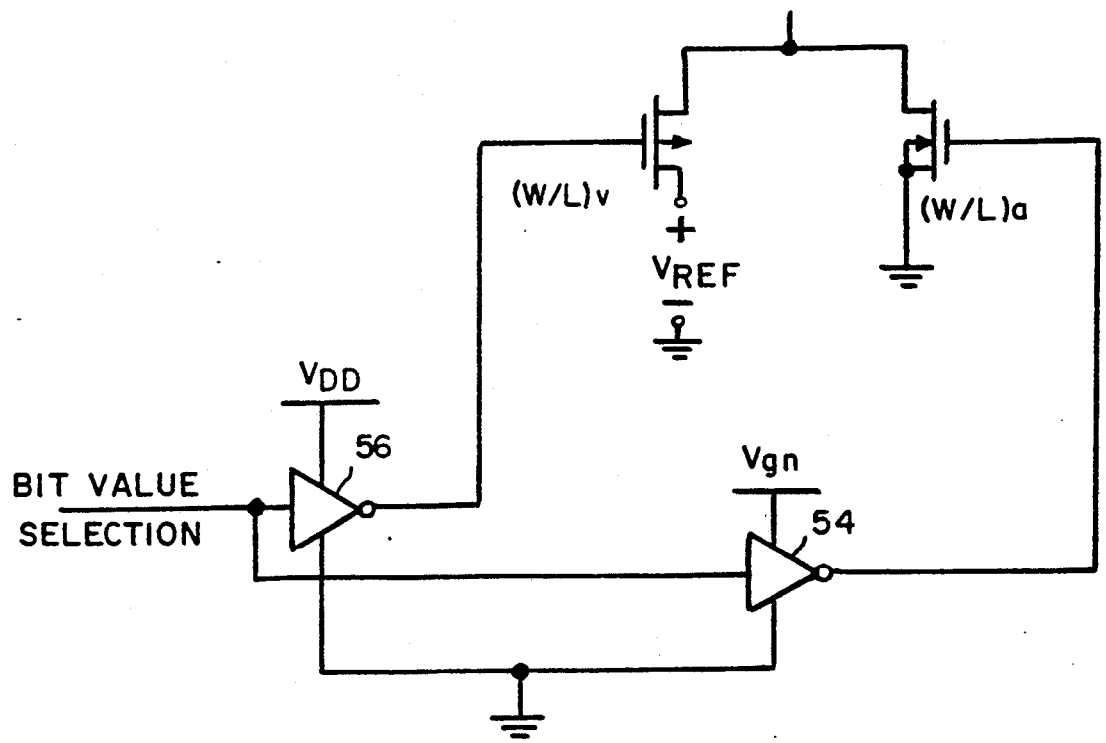
FIG. 10 is a schematic circuit diagram for a driver for supplying the gate voltage to the n-channel Agnd MOSFET switch and to the p-channel $V_{ref}$ MOSFET switch in the switch pair of FIG. 9.

Referring now to FIG. 9, there is a shown a DAC switch (or switch pair) 50 according to the present invention. Switch 50 is constructed with an n-channel MOSFET $52_0$ switching to Agnd and a p-channel MOSFET $52_1$ switching to $V_{ref}$. The p-channel device is the preferred element to use as the reference voltage switch, as it allows $V_{ref}$ to be made large relative to the supply voltage, $V_{dd}$. Device $52_1$ is "ON" with 0 volts applied to the gate, under which condition $V_{gs} = -V_{ref}$. It is "OFF" when the supply voltage $V_{dd}$ is applied to the gate. In contrast, the n-channel device is the preferred element to use as the Agnd switch. It is "ON" with a high voltage (i.e., $V_{gn}$ which may approach $V_{dd}$) applied to the gate; and it is "OFF" with 0 volts applied to the gate.

Figure 11:
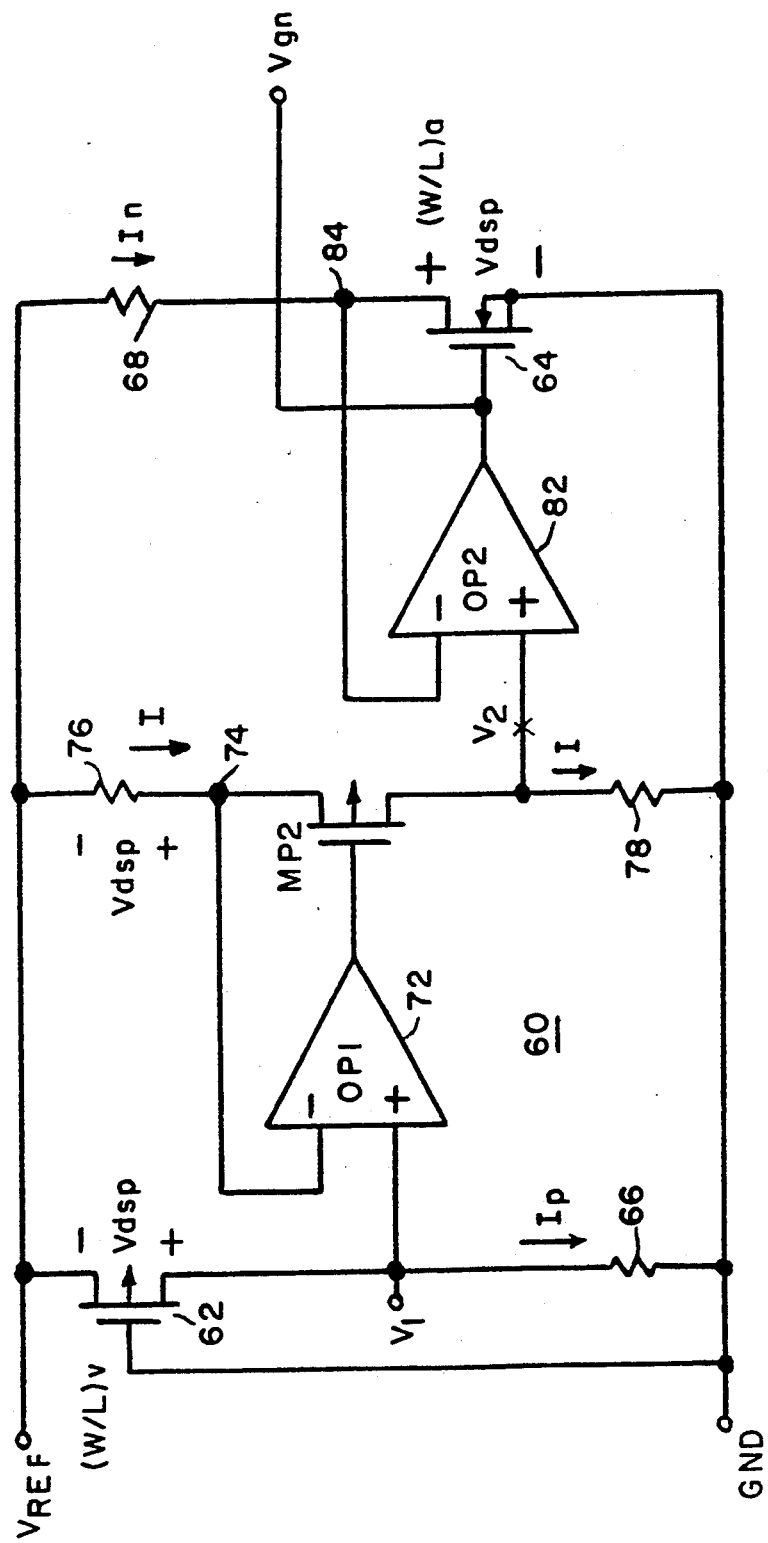
FIG. 11 is a schematic circuit diagram for a gate-voltage generator circuit for supplying the required drive voltage, $V_{gn}$, needed by the circuit of FIG. 10 to match the $R_{ON}$ of the n-channel MOSFET to the $R_{ON}$ of the p-channel MOSFET, according to an exemplary embodiment of the present invention.

Matching of the $R_{ON}$ values for the n-channel devices $52_0$ and p-channel devices $52_1$ is achieved by controlling the "ON" gate voltage of one of the devices. In the particular example more fully illustrated and discussed below, the gate-source voltage, $V_{gs}$, for the Agnd n-channel switches is controlled. This voltage is provided by a driver 54 which is powered from a voltage $V_{gn}$, which will be developed in a manner discussed below. Note that, in contrast, with the p-channel driver 56 is powered by the supply voltage $V_{dd}$. The voltage $V_{gn}$ is variable and is generated by a "$V_{gn}$ generator circuit" 60 shown in FIG. 11.

The Vgn generator circuit 60 includes a p-channel reference device 62 and an n-channel device 64. These two devices are identical (e.g., geometrically) to the p-channel and n-channel MOSFET, in the DAC switch pairs, respectively. The $R_{ON}$ of n-channel device 64 is matched to that of p-channel device 62 by forcing the two devices to operate with the same drain current and drain-source voltages. Both MOSFETs are operated in the non-saturated region. They conduct load currents as determined, respectively, by load resistors 66 and 68, which are of equal value. The current $I_p$ through resistor 66 develops across that resistor a voltage which varies with the drain-source voltage $V_{ds}$ of p-channel MOSFET 62, according to the formula $V_1 = V_{ref} - V_{dsp}$. Operational amplifier 72 senses this voltage (i.e., $V_1$) at its non inverting input and forces (by way operation of the virtual ground principle) node 74, at its inverting input, to the same voltage. This has the effect of impressing across resistor 76, the same voltage $V_{dsp}$ as appears across MOSFET 62, and generates a current I in resistor 76 where $I = V_{dsp}/R_{76}$, $R_{76}$ denoting the resistance of resistor 76. A like current appears in resistor 78, which generates a voltage $V_2$ at the non-inverting input of operational amplifier 82, such that $V_2 = (I)(R_{78})$. Resistors 76 and 78 are selected to have the same resistance. Accordingly, $V_2 = V_{dsp}$. The voltage at node 84 must be the same as the voltage $V_2$ at the non-inverting input of op-amp 82, by virtue of the virtual ground principle. This generates in resistor 68 a current $I_n = R_{68} (V_{ref} - V_{dsn})$. If the resistance of resistor 68, $R_{68}$, equals $R_{66}$, then $I_n$ equals $I_p$ and the drain source voltage across the n-channel device 64, $V_{dsn}$, is the same as the drain source voltage across the p-channel device 62, $V_{dsp}$. Since the n-channel MOSFET 64 operates with the same current and at the same drain-source voltage as the p-channel MOSFET 62, it is forced to have the same $R_{ON}$ characteristic as MOSFET 62. Moreover, by making $R_{66}$ and $R_{68}$ equal to the ladder resistance, the drain current of MOSFETs 62 and 64 are made similar to the currents in the ladder legs.

The output from the generator circuit 60 is a voltage $V_{gn}$ which is used to power the Agnd switch driver 54; $V_{gn}$ is taken from the output of operational amplifier 82. Driver 54 may be a standard inverter whose output voltage equals its supply voltage, which in this case is $V_{gn}$; in the "high" state. Consequently, the circuit 60 forces the $R_{ON}$s of the n-channel Agnd switches to track the $R_{ON}$s of the p-channel $V_{ref}$ switches, even over varying reference voltage and temperature conditions.

Figure 12:
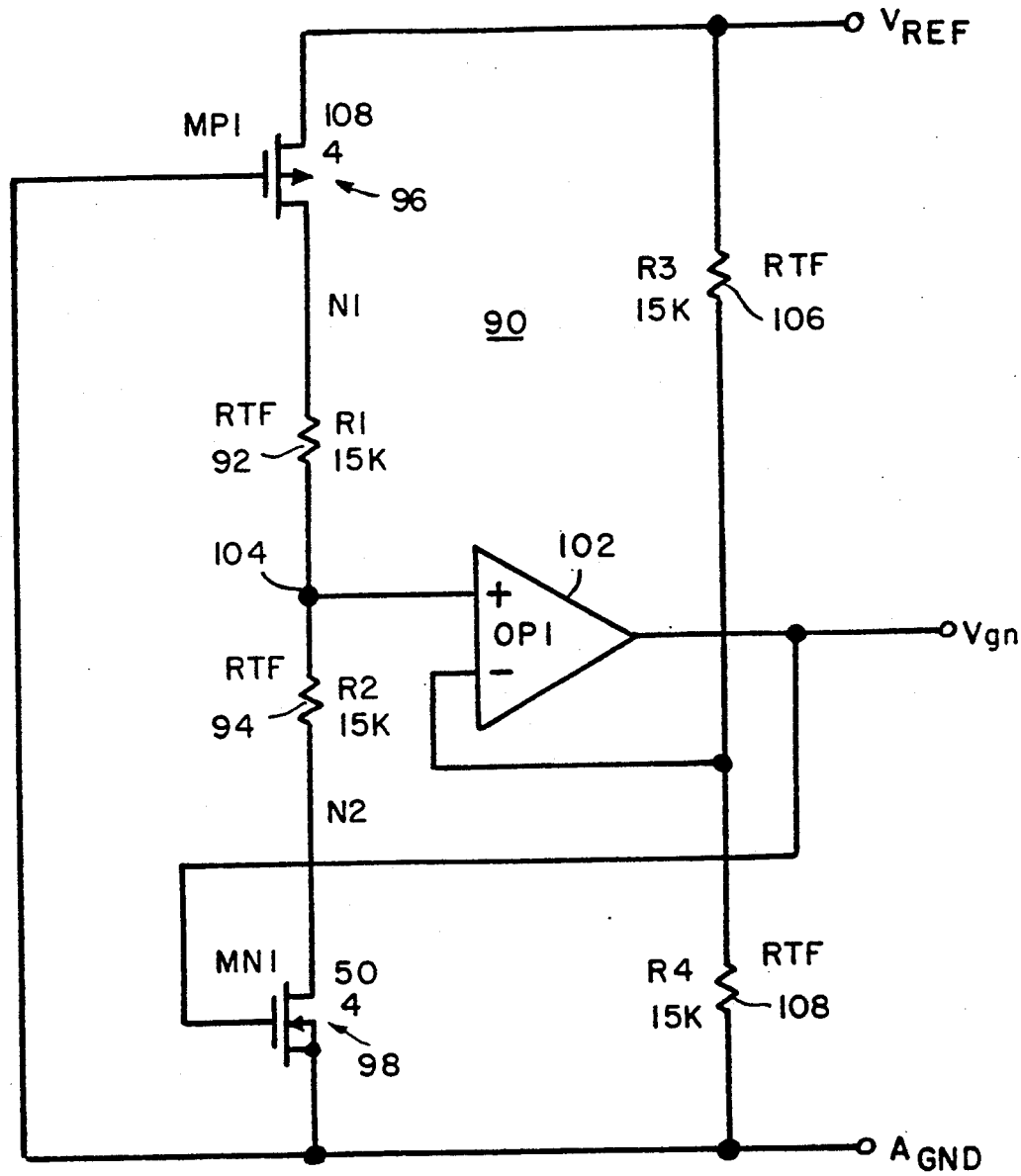
FIG. 12 a schematic circuit diagram for a second embodiment for a gate-voltage generator circuit according to the present invention.

Another embodiment 90 for a generator for the $V_{gn}$ gate drive signal is shown in FIG. 12. There, resistors 92 and 94 form a bridge circuit with p-channel MOSFET 96 and n-channel MOSFET 98. Since $R_{92}$ and $R_{94}$ are set to the same value (to a very precise tolerance), the bridge will only be balanced when the $R_{ON}$ value of p-channel MOSFET 96 equals the $R_{ON}$ value of n-channel MOSFET 98. The non-inverting input of operational amplifier 102 senses the voltage at node 104, at the junction of resistors 92 and 94, while the inverting input of the operational amplifier is held at a fixed voltage $V_{ref}/2$ (referred to Agnd), by the voltage divider formed by equal-valued resistors 106 and 108. Consequently, operational amplifier 102 senses any deviation at node 104 from the voltage $V_{ref}/2$ caused by imbalance in the bridge. The output of the operational amplifier drives the gate of n-channel FET 98, to serve its $R_{ON}$ value to match that of p-channel FET 96, so as to maintain the bridge in balance. As in the prior embodiment, the drive voltage to the n-channel reference device 98 in the generator circuit also is the circuit's output output voltage, $V_{gn}$, which is used to drive the n-channel Agnd switches.

The technique taught herein has significant advantages over the aforementioned prior art approaches. Unlike the prior art, the reference voltage can be up to and including the most positive power supply voltage. Optimum switch matching is achieved. The requirement that $V_{dd}$-$V_{ref}$ be much greater than $V_{ds}+V_T$ (i.e., the threshold voltage) is no longer applicable. Moreover, any relative changes in device characteristics caused by temperature changes are automatically compensated. Advantageously, the complete circuit (i.e., voltage reference, DAC, $V_{gn}$ generator, drivers, and so forth) can be made to operate off a single positive supply rail. Additionally, since the $V_{ref}$ switches and Agnd switches are driven by similar drivers 56 and 54, respectively, complementary drives are no longer required. This permits very close matching of the switching times of the outputs of drivers 54 and 56, when a bit changes state. Inherently, this allows faster operation of the DAC.

Having thus described the inventive concept and a specific exemplary embodiment for practice of the invention, it is recognized that various alterations and improvements will readily occur to readers skilled in the art. These alterations and improvements, though not expressly stated, are intended to be suggested by this disclosure. For example, the $V_{gn}$ generator could readily be rearranged to use the n-channel device as a reference and to provide a drive signal to the p-channel device to cause its $R_{ON}$ to match that of the n-channel device. Accordingly, it will be understood that the foregoing description is not intended to be limiting, but is presented by way of example only. The invention is limited only as required by the claims which follow and by equivalents thereto.

What is claimed is:

1. In a voltage-switching digital-to-analog converter having a resistive ladder which has multiple legs and further having, for each such leg, a switch pair including a $V_{ref}$ switch for selectively switching the leg to a $V_{ref}$ source and an Agnd switch for selectively switching the leg to an analog ground connection, wherein $V_{ref}$ refers to a voltage reference, the improvement comprising:

a. each $V_{ref}$ switch being a p-channel FET and each Agnd switch being an n-channel FET;
   b. for each switch pair, the drain electrodes of the p-channel and n-channel FETs being connected together and to the associated leg of the ladder; and
   c. drive generator means connected to a selected one of the FET's for supplying thereto a drive signal causing the "ON" resistance of the selected FET to match the "ON" resistance of the other FET, including:
      1. a second n-channel FET and a second p-channel FET; and
      2. means for causing the drain currents of the second FETs to match and for causing the drain-source voltages of the second FETs to match, to generate the drive signal.

2. The digital-to-analog converter as set forth in claim 1 wherein the drive signal is the signal on the gate of one of the second FETs.

3. The digital-to-analog converter as set forth in claim 1 wherein said means for causing the drain currents of the second FETs to match and for causing the drain source-voltages of the second FETs to match comprises:

a. a first load resistor and a second load resistor of equal value, each of said resistors being connected in series with one of the second n-channel FET and second p-channel FET, respectively, and the $V_{ref}$ source; and
   b. means responsive to the voltage across the first load resistor for driving the second n-channel FET to produce a voltage, across the second load resistor, equal to the voltage across the first load resistor.

4. In a voltage-switching digital-to-analog converter having a resistive ladder which has multiple legs and further having, for each such leg, a switch pair including a $V_{ref}$ switch for selectively switching the leg to a $V_{ref}$ source and an Agnd switch for selectively switching the leg to an analog ground connection, wherein $V_{ref}$ refers to a voltage reference source, the improvement comprising:

a. each $V_{ref}$ switch being a p-channel FET and each Agnd switch being an n-channel FET;
   b. for each switch pair, the drain electrodes of the p-channel and n-channel FETs being connected together and to the associated leg of the ladder; and
   c. drive generator means connected to a selected one of the FET's for supplying thereto a drive signal causing the "ON" resistance of the selected FET to match the "ON" resistance of the other FET, including:
      1. a second n-channel FET and a second p-channel FET; and
      2. means for causing the "ON" resistances of the second FETs to match, including:
   a. a bridge circuit arrangement of two resistors of equal value and said second FETs, the bridge circuit being balanced when said "ON" resistances of said second FETs match; and
   b. means responsive to the voltage at a selected node of the bridge circuit for driving one of the second FETs to balance the bridge by causing the "ON" resistance of said one of the second FETs to match the "ON" resistance of the other second FET, and to supply the drive signal to the selected FET in the switch pair.

* * * * *